(12) United States Patent
Sugihara et al.

(10) Patent No.: US 7,166,827 B2
(45) Date of Patent: Jan. 23, 2007

(54) CONTACT-TYPE IMAGE SENSOR MODULE AND IMAGE READING APPARATUS USING THE MODULE

(75) Inventors: Hirohisa Sugihara, Tokyo (JP); Takafumi Endo, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 172 days.

(21) Appl. No.: 10/771,541

(22) Filed: Feb. 5, 2004

(65) Prior Publication Data

US 2005/0006562 A1  Jan. 13, 2005

(30) Foreign Application Priority Data

Jul. 8, 2003  (JP) .............................. 2003-193410

(51) Int. Cl.
  *H01L 27/00* (2006.01)
  *H04N 1/04* (2006.01)
  *H04N 1/00* (2006.01)

(52) U.S. Cl. .................. 250/208.1; 358/482; 358/483; 358/475; 358/408

(58) Field of Classification Search ................ 358/483, 358/482, 497, 512, 513, 496, 474, 473, 514, 358/408, 475; 250/208.1; 399/364, 211, 399/212
See application file for complete search history.

(56) References Cited

U.S. PATENT DOCUMENTS 5,144,458 A * 9/1992 Adachi et al. ............... 358/482
5,281,803 A * 1/1994 Ishizuka .................. 250/208.1
5,489,992 A   2/1996 Endo
5,604,606 A * 2/1997 Miyashita et al. ........... 358/474
5,773,818 A * 6/1998 Herloski ..................... 250/226
5,999,277 A * 12/1999 Tsai ........................... 358/498
6,111,244 A   8/2000 Wang
6,349,155 B1* 2/2002 Youda et al. ................ 382/312
2002/0121590 A1* 9/2002 Yoshida et al. ........... 250/208.1
2004/0105135 A1* 6/2004 Sawada ....................... 358/509

FOREIGN PATENT DOCUMENTS

| CN | 1343955 A | 4/2002 |
|---|---|---|
| JP | 7-147620 | 6/1995 |
| JP | 9-321947 | 12/1997 |
| JP | 2000-236415 | 8/2000 |

* cited by examiner

*Primary Examiner*—George Epps
*Assistant Examiner*—Don Williams
(74) *Attorney, Agent, or Firm*—Oblon, Spivak, McClelland, Maier & Neustadt, P.C.

(57) ABSTRACT

In color reading including an infrared light source, light reflected by a document focuses on a light-receiving part of a sensor IC with different conjugate lengths, due to color aberration of the rod-lens. Since the wavelength of the infrared light is relatively long, the deterioration of the reading resolution appears to be extensive. Here, when reading a document such as a valuable security or a paper bill, a defocusing phenomenon has been prevented, and when reading by infrared light, a high accurate reading characteristic has been realized. As a solution, light is irradiated from a light output window (101*a*) of a light source (101) and reflected by a document (8), and an infrared light shielding area is provided on a bottom face of a glass (51) placed in an optical path of the light reflected by the document (8), between the document (8) and a sensor IC (3).

14 Claims, 7 Drawing Sheets

Document, such as paper Bill, Valuable Security, etc.

CONTACT-TYPE IMAGE SENSOR MODULE AND IMAGE READING APPARATUS USING THE MODULE

BACKGROUND OF THE INVENTION

1. Field of the Invention

The present invention relates to contact-type image sensor modules used by image reading apparatuses in identifying valuable securities and paper bills, and in particular, it relates to such modules and apparatuses that enable prevention of defocusing phenomena caused by chromatic aberrations, when reading by polychromatic light sources using infrared light sources, and enable high accuracy reading.

2. Description of the Related Art

Figure 14:
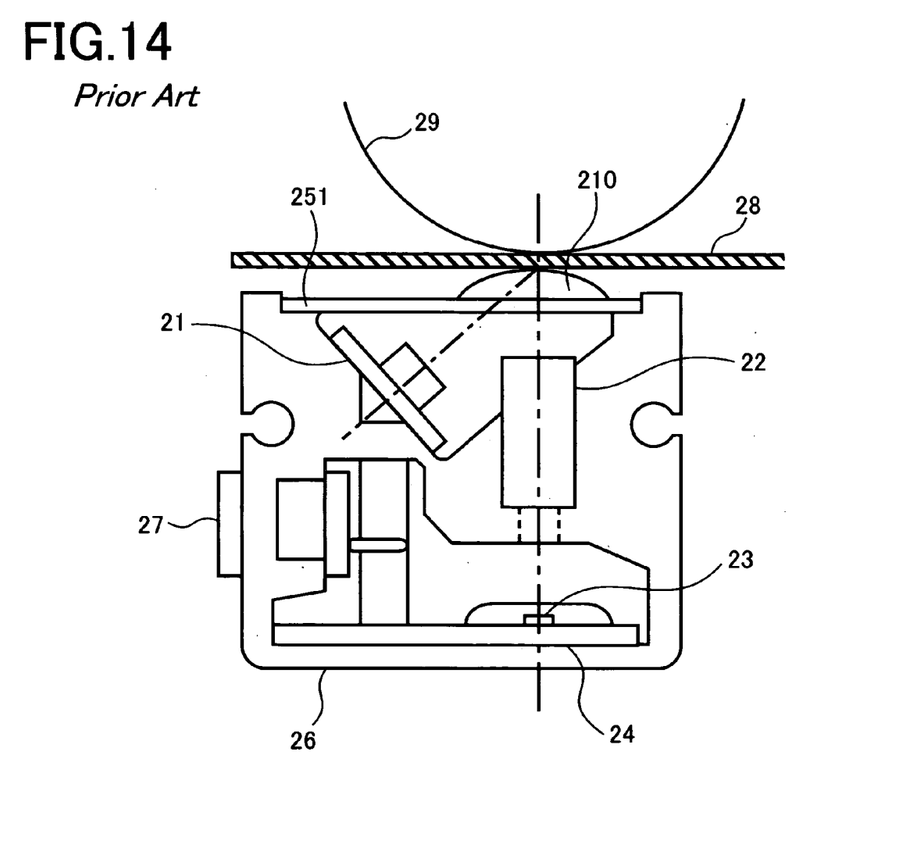
FIG. 14 is a cross sectional view of a contact-type image sensor module disclosed in Japanese Patent Publication No. 3,011,845.

A conventional contact-type image sensor module is disclosed in Japanese Patent Publication No. 3,011,845, wherein, in order to prevent defocusing phenomena when reading documents, a focus-position is determined by providing a protrusion for a conveyed document and by contacting the document against the top of the protrusion. Moreover, by coating infrared light shielding paint on the protrusion only visible light is allowed to shine in. FIG. 14 is a cross sectional configuration diagram illustrating the structure of a contact-type image sensor module, disclosed in the publication No. 3,011,845. In FIG. 14, numeral 21 denotes a light source, numeral 22 denotes a lens, numeral 23 denotes a sensor IC, numeral 24 denotes a sensor substrate, numeral 251 denotes a glass plate, numeral 26 denotes a housing, numeral 27 denotes a connector, numeral 28 denotes a document, numeral 29 denotes a conveying platen, and numeral 210 denotes a protrusion.

Next, the operation will be explained. The light emitted from the light source 21 passes through the glass plate 251 and the protrusion 210, and arrives at the portion of the document 28 having text and character. The light is absorbed by the black portions that are the text, while the light is reflected approximately 100% in the white portions that have the background color of the document. The reflected light passes through the glass plate 251 and the protrusion 210, is focused by the lens 22, and is received by light receiving portion of the sensor IC 23 on the sensor substrate 24. The sensor IC 23 comprises a plurality of light-receiving parts where the light incident on each light-receiving part is photoelectrically converted, and a driver portion from which the output power is extracted. The received light is converted into an electrical signal in the driver portion, and outputted as image information through the connector 27. Text, etc. written on the document 28 is consecutively read out line by line, while the document 28 is conveyed by the rotation of the platen 29.

When using a monochrome light source or a white light source (e.g. a cold-cathode tube) which includes a plurality of light components, because the light source itself is monochrome and is driven singly, problems related to chromatic aberrations with respect to light sources have been ignored, since reading monochrome documents has been the main object. However, in situations where color documents are read and the light source is in a plurality of colors and driven independently, the light reflected by the document focuses on the light-receiving part of the sensor IC at different conjugate lengths, due to the chromatic aberrations in the rod lens, etc. In particular, when using an infrared (IR) light source, the conjugate length is extremely longer than the red (R), green (G) and blue (B) light which is alternative light sources. The conjugate length between the surface of the document and the light-receiving part of the contact-type image sensor modules is generally determined by the R, G and B (the three fundamental colors for color reading) light, therefore when reading the document using IR light, the resolution may deteriorate. Accordingly, there has been a problem of being unable to read all of document colors in high resolution.

Moreover, light shielding technology represented by infrared filters has been used in order to block out infrared light itself. Consequently, when using an infrared light source, blocking out the infrared light has been originally unnecessary on principle.

SUMMARY OF THE INVENTION

The present invention has been made in order to resolve the above problems, and an object is to provide contact-type image sensor modules which can read out image information with sufficient accuracy without deteriorating reading accuracy of color documents such as paper bills and valuable securities/certificates, and also to provide image reading apparatuses that include these modules.

A contact-type image sensor module according to the present invention comprises: a light source for irradiating two or more sorts of light including infrared light on a document; a lens for focusing light reflected from the document; a light-receiving part for receiving the reflected light focused by the lens; a housing for containing at least the lens and the light-receiving part; and a transparent element to which the document draws near or comes into contact with; the transparent element supported by the housing, and provided on an area thereof through which the reflected light passes with infrared light shielding extending to a width of 0.1 through 0.4 mm in a direction orthogonal to that in which the document travels.

A contact-type image sensor module according to the present invention comprises: a light source for irradiating two or more sorts of light including infrared light on a document; a lens for focusing reflected light from the document; a light-receiving part for receiving the reflected light focused by the lens; a housing for containing at least the lens and the light-receiving part; a transparent element for passing through the reflected light; and a document guide to which the document draws near or comes into contact with, the document guide is supported by the housing attachably to or detachably from the housing, and fixes the transparent element.

A contact-type image sensor module according to the present invention comprises: a light source for irradiating two or more sorts of light including infrared light on a document; a lens for focusing reflected light from the document; a light-receiving part for receiving the reflected light focused by the lens; a housing for containing at least the lens and the light-receiving part; and a document guide to which the document draws near or comes into contact with, the document guide is supported by the housing attachably to or detachably from the housing.

A contact-type image sensor module according to the present invention comprises: a light source for irradiating two or more sorts of light including infrared light on a document; a lens for focusing reflected light from the document; a light-receiving part for receiving the reflected light focused by the lens; a housing for containing at least the lens and the light-receiving part; a transparent element placed on a part of an area of the element for passing through the reflected light; and a document guide for fixing the transparent element, the document guide to which the document draws near or comes into contact with, and supported by the housing.

BRIEF DESCRIPTION OF THE DRAWINGS

FIG. 10 is a schematic view which explains reading areas on a paper bill or the like;

DETAILED DESCRIPTION OF THE PREFERRED EMBODIMENTS

Embodiment 1

Figure 1:
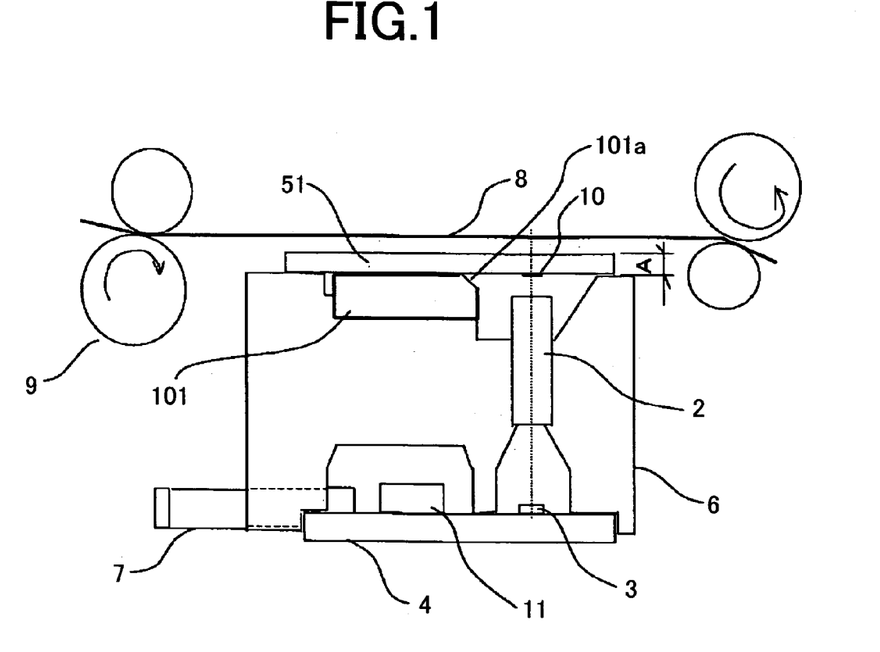
FIG. 1 is a cross sectional view of a contact-type image sensor module according to Embodiment 1 of the present invention.

FIG. 1 is a cross sectional view of a contact-type image sensor module according to Embodiment 1 of the present invention. In FIG. 1, numeral 101 denotes a polychromatic light source including an infrared (IR) light source, numeral 2 denotes a one-to-one erect-imaging lens that focuses light, as represented by a rod lens array, and numeral 3 denotes a sensor IC that receives the light focused by the lens 2 and has a plurality of light-receiving parts. Numeral 4 denotes a sensor substrate including the sensor IC 3 having a plurality of light-receiving parts that are aligned in the shape of a straight line to fit in the reading width; numeral 51 denotes a glass as a transparent element; numeral 6 denotes a housing which contains the light source 101, the lens 2 and the sensor substrate 4; numeral 11 denotes an electronics unit including a driver IC for driving the sensor IC 3; numeral 7 denotes a connector that delivers input/output signals such as an image-reading signal; numeral 8 denotes a document such as a paper bill; numeral 9 denotes a conveying platen (a driving roller); and numeral 10 denotes infrared light shielding paint provided on the inner surface of the glass 51. In addition, numeral 101a denotes a light output window of the light source 101. Light from all of the light sources is emitted from this light output window 101a toward the document 8.

The light emitted from the light output window 101a of the light source 101 passes through the glass 51, and arrives at an image portion of the document 8. The light is absorbed in black portions of the image, and is moderately reflected by the image colors corresponding to each light source. In white portions of the image, the light is reflected almost 100%. While the light reflected on the document passes through the glass 51 again as scattered light, a part of it passes through an area of the infrared light shielding paint 10, and is focused by the lens 2, and then received by the light-receiving portion of the sensor IC 3 on the sensor substrate 4. The sensor IC 3 comprises a plurality of light-receiving parts where light received by each light-receiving part is photoelectrically converted, while the electronics unit 11 comprises a driver from which the output power is extracted. The photoelectrically converted light is outputted as image information through the connector 7 in the form of serial signals. Color images written on the document 8 are consecutively read out line by line, with the document 8 being conveyed by the rotation of the platen 9.

The light source 101 includes three light sources, that is, IR (infrared), R (red), and G (green) light sources, in this embodiment, and images are read out by switching them sequentially at intervals of 0.1 ms. The reflected light corresponding to each light source is inputted into the light-receiving part as the image information of the document. In this case, due to the chromatic aberration of the lens 2, the conjugate length (also known as the optical length), which means the focal length from the sensor IC 3 that is installed on the sensor substrate 4, to the document, differs depending on the wavelength of each light source.

Figure 2:
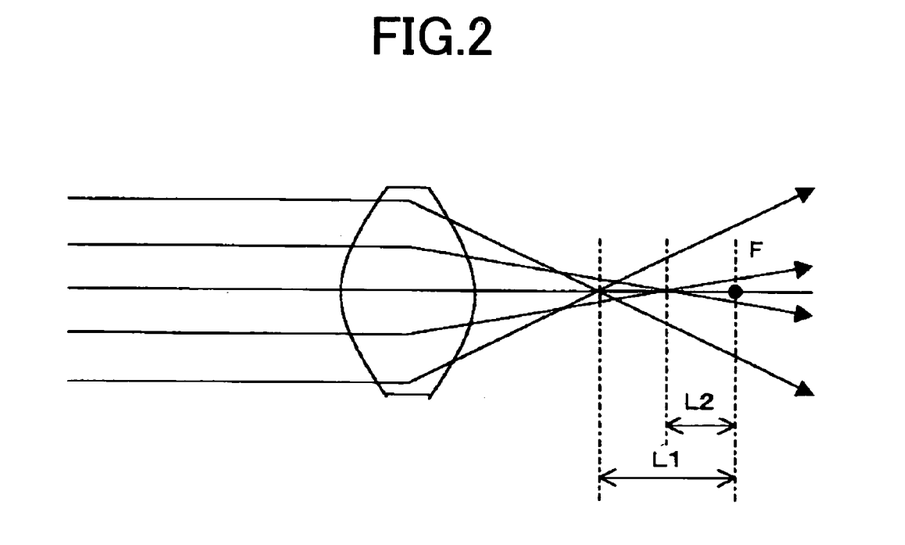
FIG. 2 is a schematic view related to a spherical aberration of a spherical lens, etc.

In this embodiment, the sensor IC 3 having a resolution of 200 DPI is used, and the conjugate length for the IR light source is 11.0, 9.6 for the R light source, and 9.0 for the G light source. Therefore, a defocusing phenomenon (a defocusing phenomenon due to a chromatic aberration) occurs due to the difference of the optical length from the document to the light-receiving part depending on the wavelength of each light. Moreover, for example, as illustrated in FIG. 2, the defocusing phenomenon due to a spherical aberration of a lens (a focal difference between the light passing through near the optical axis of the lens and the light passing through the perimeter portion of the lens) is also considered to occur. Particularly, in the contact-type image sensor modules, hereinafter also called as units, in which the optical length is set in the proximity of the R light source or the G light source on the assumption the reading is by colors, the defocusing phenomenon due to the spherical aberration becomes greater, because the optical length of the IR light is extremely long compared with another light-source wavelength.

Therefore, in this embodiment, compensation for the chromatic aberration has been carried out using the spherical aberration characteristics. That is, this defocusing phenomenon has been remedied by using the lens 2 that maintains the rod-lens diameter of 0.6 φ, by shielding (absorbing) the IR light that is directly incident into the lens 2 among the scattered light reflected on the document, and by print-forming the infrared light shielding paint 10 on the bottom face of the glass 51 along the light-receiving parts of the sensor IC 3, so as to receive the IR light from the perimeter portion of the lens 2. Although infrared light shielding material (resin) is generally used in order to shield IR light completely, it is applied to only a limited portion of area in this embodiment. This is the reason why the lens 2 used in this embodiment has a similar refractive-index distribution to the lens having the spherical aberration (when a parallel beam is irradiated, an image forming position varies based on a light incident position, and, in this case, the incident light from the perimeter portion of the lens focuses in a short distance) as illustrated in FIG. 2. Therefore, where a reflected surface such as a document is provided in advance, among the scattered light reflected on the document, the diffracted light from the perimeter portion, compared to the direct light, can be considered apparently to form image in a shorter distance due to the intervention of the glass 51. This acts as effective light and remedies the defocusing phenomenon.

Figure 3:
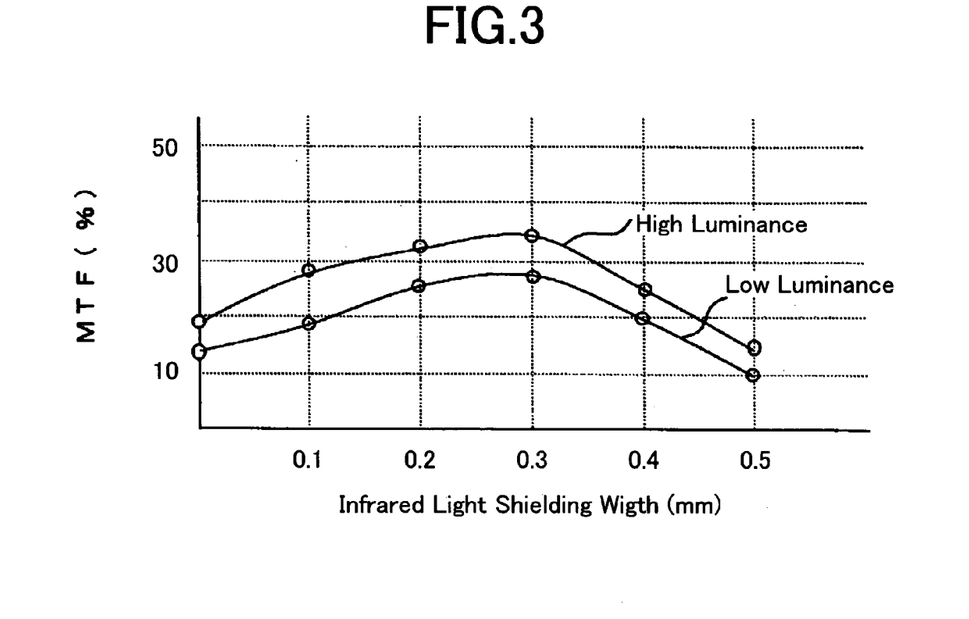
FIG. 3 is a diagram for explaining relations between infrared light shielding widths and MTFs according to Embodiment 1 of the present invention.

FIG. 3 illustrates relations between the MTFs (Modulation Transfer Functions), which give indications of resolution, and the widths of the infrared light shielding area, when using the unit in this embodiment. In consideration of fluctuation in light-source luminance, measurement has been carried out by splitting the IR light-source power into low output and high output. In the case of high output (high luminance) irradiation, when the printing width of the infrared light shielding paint 10 coated on the glass 51 is approximately 0.3 mm, the MTF is found to rise to approximately double compared to that in the unshielded case. Moreover, even if low output (low luminance) irradiation is carried out, similar effect is found to be obtained. When the shielding width exceeds 0.3 mm, the rapid fall of the MTF is observed. This is considered to be because the effective IR-light amount being incident on the lens 2 results in significant decrease. In addition, the appropriate thickness of the infrared light shielding paint 10 after being sintered on the glass 51 is approximately 7 μm, and thus the scattered direct light may be sufficiently shielded.

In the MTF measurement of this embodiment, the purpose of reading by IR light is to prevent interpolation of paper bills (documents) against a paper-currency identifying machine or the like, and reading resolution can be comparatively low since the main purpose is to detect an area of the printed portion which reacts to the IR light rather than to determine text on the paper bill, therefore the measurement has been carried out using a test chart with 2 line pairs/mm (2 sets of monochrome stripe patterns in 1 mm). In the case of the light-receiving-element arrangement that has been configured with the resolution of 200 DPI in this embodiment, it is generally considered that the resolution of this type of MTF is required to be 20% or more, therefore the infrared light shielding width of 0.1 mm to 0.4 mm is optimal.

As described above, according to this embodiment, in the contact-type image sensor module that uses the polychrome light sources including IR light source, since infrared light shielding is provided near the optical axis center of the optical path on the bottom face of the glass so as to reduce the defocusing phenomenon of IR light when the module is designed with the optical length or focal length other than that for IR light, scattered direct light that is incident into the lens after being reflected on the surface of the document decreases, the light incident from the perimeter becomes dominant, and thus extension of the apparent optical length of the IR light is made possible. Accordingly, the resolution deterioration when reading by IR light can be prevented.

According to this embodiment, since the scattered direct light among the scattered IR light reflected on the surface of the document, which causes the defocusing phenomenon, is shielded by painting on the transparent element infrared light shielding paint with width of 0.1 mm to 0.4 mm, the defocusing phenomenon is remedied resulting in effective IR light reading with high resolution.

Embodiment 2

Figure 4:
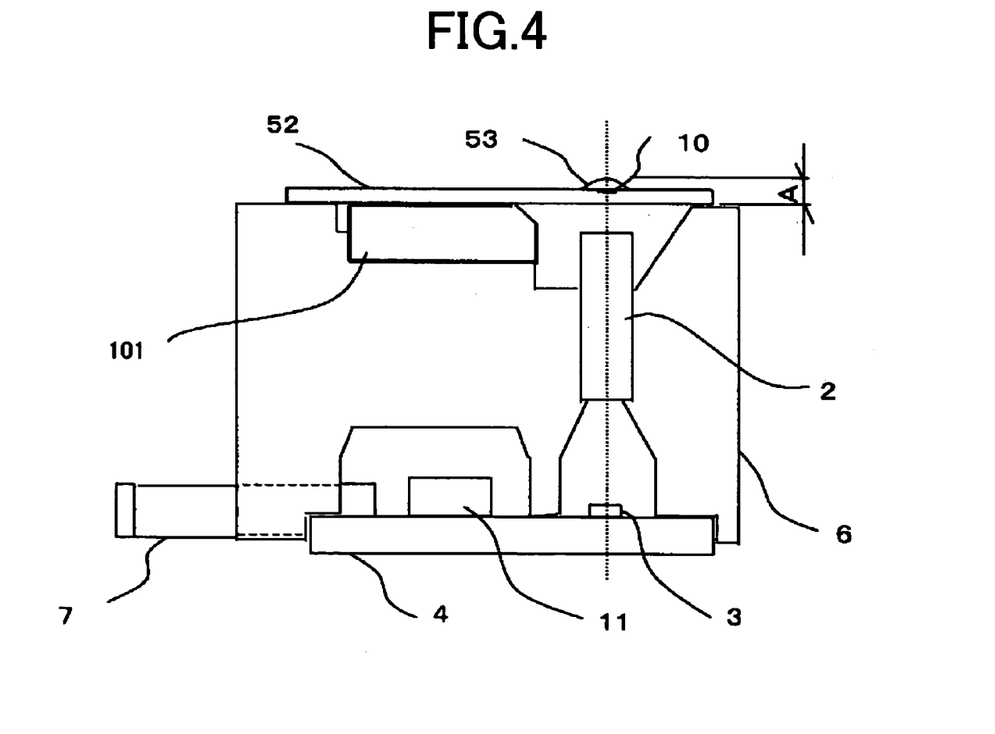
FIG. 4 is a cross sectional view of a contact-type image sensor module according to Embodiment 2 of the present invention.

FIG. 4 is a view, in which a protrusion-shaped glass 53 is adhered on the top face of a glass 52 to form a protrusion. This glass 53 is in a hemispherical protruding form with the infrared light shielding paint 10 on its plane side, and is placed on the glass 52. In this case, since the protrusion 53 is newly added between the document and the light-receiving part, thickness of the glass 52 is made thinner by the thickness of the protrusion 53, so that the optical dimension to the R and G light reading is maintained.

In the configuration illustrated in Embodiment 1, since the infrared light shielding paint 10 is painted above and near the optical axis center of the lens 2 through which the reflected light passes, the amount of light decreases. In contrast, in this embodiment, although the scattered direct IR light that is scattered from the document surface is shielded by the infrared light shielding area, the incident-light amount of diffractive light to the lens 2 increases due to the focusing effect of the glass 53 and a refractive effect of the planar glass 52. Moreover, in the contact-type image sensor module that is configured optimally for the optical length of the other light such as R light, G light, etc. (the optical length of the IR light is configured shorter), it is considered that the effective light amount explained in Embodiment 1 further increases, because this IR light travels a longer optical path than the scattered direct light, and because the conjugate length for the IR light is longer.

Figure 5:
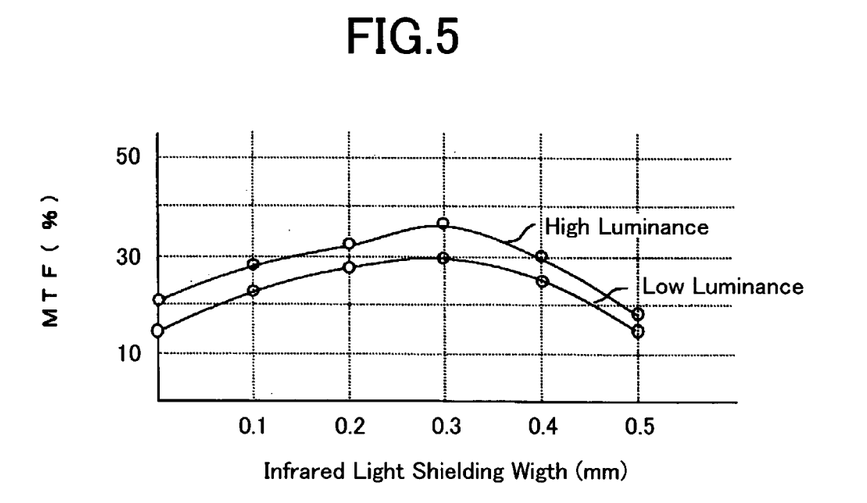
FIG. 5 is a diagram for explaining relations between infrared light shielding widths and MTFs according to Embodiment 2 of the present invention.

FIG. 5 illustrates measured results of MTF characteristics in this embodiment. The MTF characteristics are wholly improved by approximately 5% over those explained in Embodiment 1.

According to Embodiment 2, provision of the protrusion-shaped glass painted with the infrared light shielding paint on the upper surface of the glass plate has effects of increasing the IR light incident in the perimeter, due to the refractive effect of the glass plate and the light focusing effect of the hemispherical glass with a protrusion, alleviating the decrease of the output power when reading out by IR light, and consequently preventing deterioration in resolution when reading out by IR light, owing to increasing effective IR light that has a long optical length.

Embodiment 3

In Embodiment 1 and Embodiment 2, although structural designs that were suited to the optical dimensions of R and G light by painting the infrared shielding paint 10 on the glass 51 and 53 have been described, a case where the accuracy of reading by infrared light is further raised will be described. Reflected light arrives at the light-receiving part through the lens 2, and by inserting a refractive element that has larger refractive index than air in this optical path, the focal length becomes longer, even if the identically designed housing 6 is used.

Figure 6:
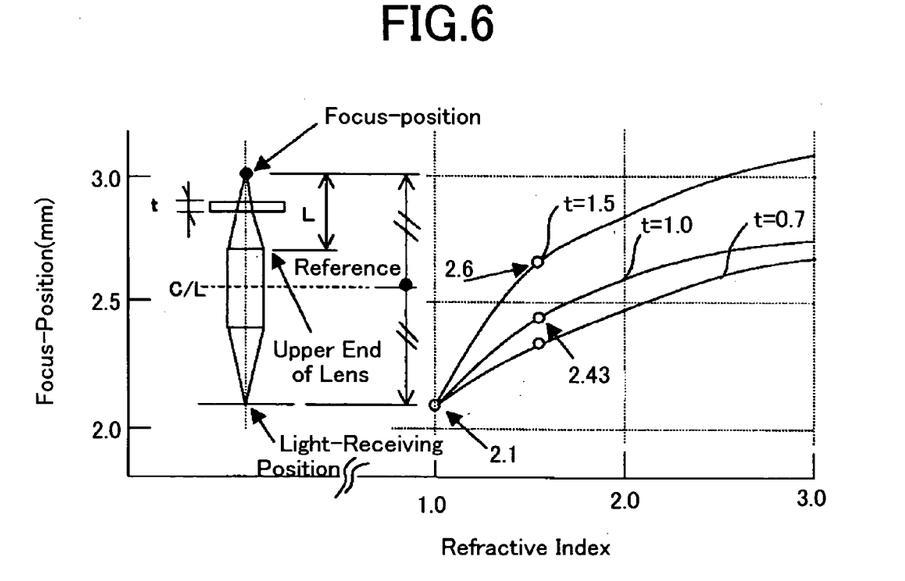
FIG. 6 is a diagram for explaining changes in focal positions of a lens according to refractive indexes of materials when the materials intervene between a document and the lens.

FIG. 6 illustrates relations between focus-positions and refractive indexes of materials. In FIG. 6, when determining, with the upper end of the lens 2 as a reference, the focus-position thereabove, the focus-positions are plotted with a substance intervening in the course between the top edge of the lens and the focus-position. Generally, when the substance is placed along the optical path, according to the refractive index of the substance, the apparent focal length becomes longer than in air. That is, $$\Delta t = \{(n-1)/n\} \cdot t$$

where $\Delta t$: amount focus position is extended, n: refractive index of substance, t: thickness of substance through which light passes. For example, when the focus-position is 2.1 mm from the upper surface of the lens 2, and air refractive index is 1.00, if a substance whose refractive index is larger than air exists in the way, the distance becomes longer than 2.1 mm. Assuming the refractive index of glass is approximately 1.51, when 1 mm thick glass intervenes, the focus-position becomes 2.43 mm, that is, the focus-position is extended by about 0.33 mm compared to the case with nothing intervening.

The extension amount differs by wavelength of light, and since the refractive index of the light with longer wavelength is smaller than that of the light with shorter wavelength even when the same substance is used, the focus-position of such an IR light source as has longer wavelength than R and G light sources, becomes longer. Therefore, when the position of a document is determined in advance with the glass intervening, removing glass is understood to lead to improvement in resolution when reading out by the IR light source.

That is, reading out by R and G light on the glass upper surface with an intervention of glass and reading out by IR light without the glass enable split-use of an IR-based contact-type image sensor module and an R-and-G based one. Therefore, the contact-type image sensor module is preferably configured such that the glass is attachable and detachable, because in conventional contact-type image sensor units the glass and the housing are adhered to each other, and removal of the glass is impossible; and because, in units in which glass is not provided, not taking into consideration the intervention of glass in designing the optical-length of the unit itself is the usual practice.

By the way, in the case of contact-type image sensor modules with glass attached, the document-face position can be estimated, and the glass face can be used also as a conveyance guide; however, since the glass is not attached when reading out by IR light, there is a problem in conveying the document 8.

Figure 7:
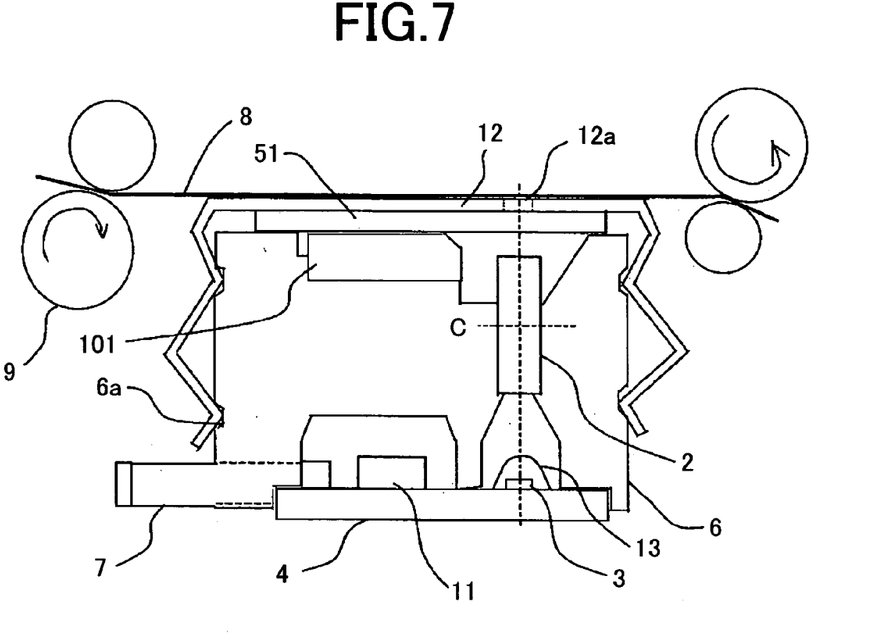
FIG. 7 is a cross sectional view of a contact-type image sensor module according to Embodiment 3 of the present invention.
Figure 8:
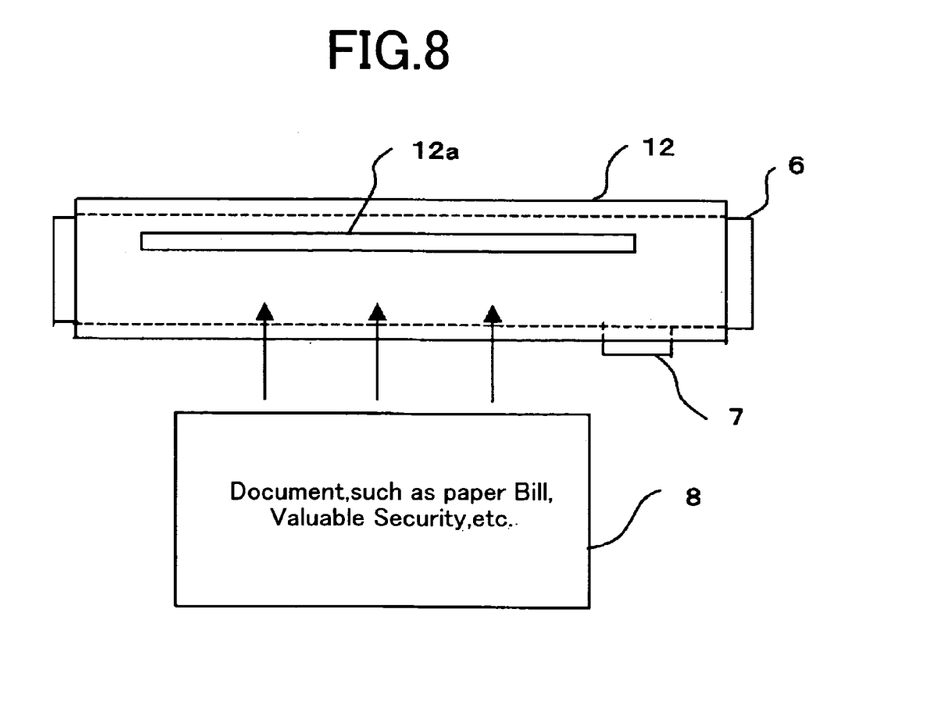
FIG. 8 is a plan view of a contact-type image sensor module according to Embodiment 3 of the present invention, and the view also explains document conveyance and a slit position on a document guide.
Figure 9:
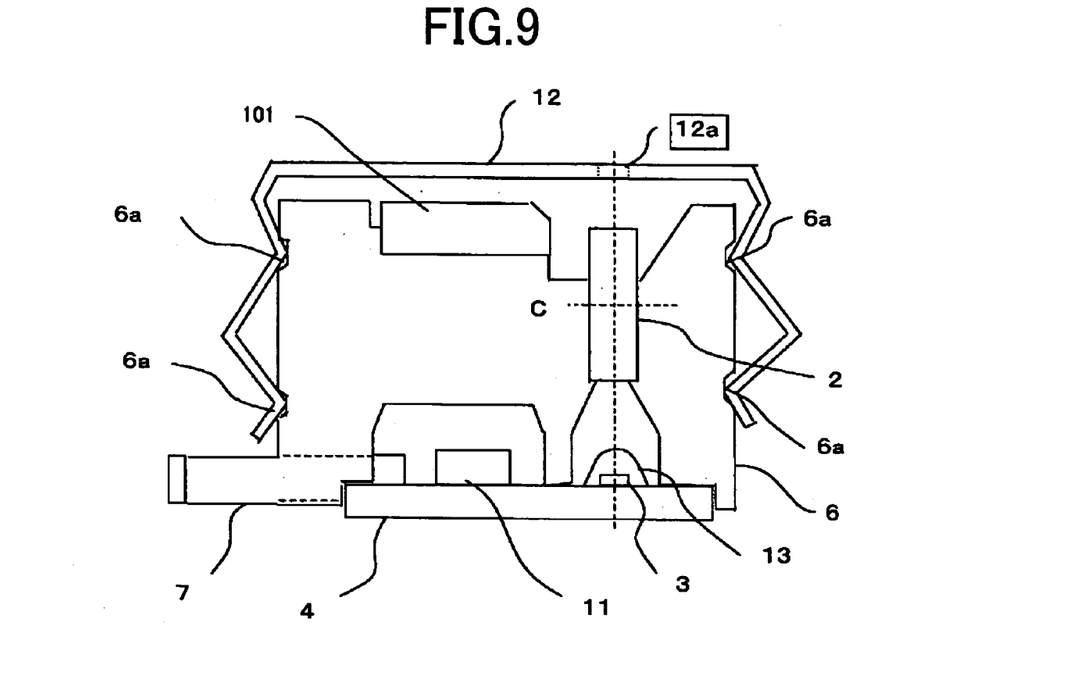
FIG. 9 is a cross sectional view of a contact-type image sensor module according to Embodiment 3 of the present invention when the glass is removed.

FIG. 7 illustrates a structure of a unit in which the glass 51 is attachable and detachable. Numeral 12 denotes a conveyance guide, and it has a structure that fixes the glass 51 and the conveyance guide itself to the housing 6. The conveyance guide 12 is made of plastic and is springy, and therefore pressing the glass and fixing it onto the housing is easy. In this embodiment, since the conveyance guide is further attached on the upper part of the glass, space is made for the document reading part of the conveyance guide by inserting a slit 12a, as illustrated in FIG. 8, so as to remove the intervention of substances, in consideration of the IR reading. Although usual reading by R or G is performed on the upper surface of the conveyance guide 12, the glass 51 is structured to be removable, as illustrated in FIG. 9, for cases of IR-based reading.

With above described configuration, the glass can be removed when reading by IR, and the focus-position can be shortened as compared with the case where the glass 51 exists. Therefore, the defocusing phenomenon of IR light can be remedied.

According to Embodiment 3, since the document guide that fixes the transparent element is provided, the document guide is held by the housing, and attaching/detaching of the glass is enabled, general reading out by R and G, and by IR is performed by selecting insertion or removal of the glass, respectively, so as to demonstrate an effect that the high accurate reading by all light source colors can be carried out. Especially, when building-in a plurality of units into an apparatus, selective incorporation of units suited to each way of reading is possible.

Moreover, according to Embodiment 3, since the slit is provided in the reading direction of the document guide, and no substances whose refractive index is higher than air intervene, the optical length can be shortened, resultantly, this can effectively remedy the defocusing phenomenon when reading by IR light.

Embodiment 4

Figure 10:
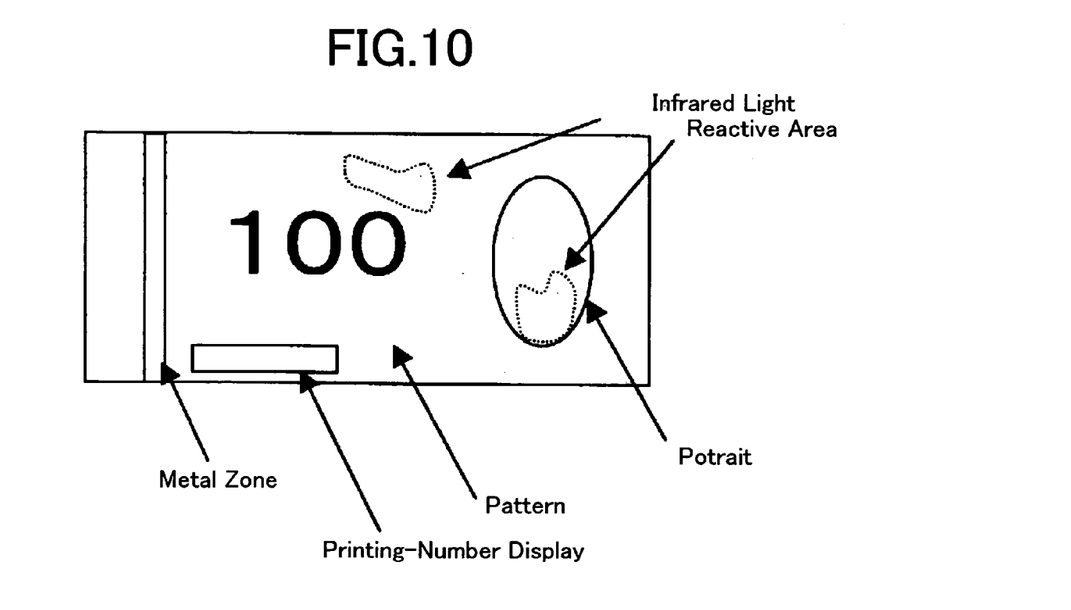

FIG. 10 is an imaginary view of patterns on a paper bill as a document. Generally, reading text and patterns on paper bills are performed by R and G light, but areas which react to invisible incident light, such as infrared and ultraviolet light, are furnished in sections of a paper bill. As for reading areas, it is common to read not all of them, but to read only appointed ones among areas. For example, when there are two infrared reactive areas as illustrated in FIG. 10, only one of their shapes (areas) may be read out, and the other may not be read out. In such a case, the glass 51 corresponding to only the specified area is removed, and in the other areas each reading out by IR, R and G light is carried out with the glass 51 intervening.

Figure 11:
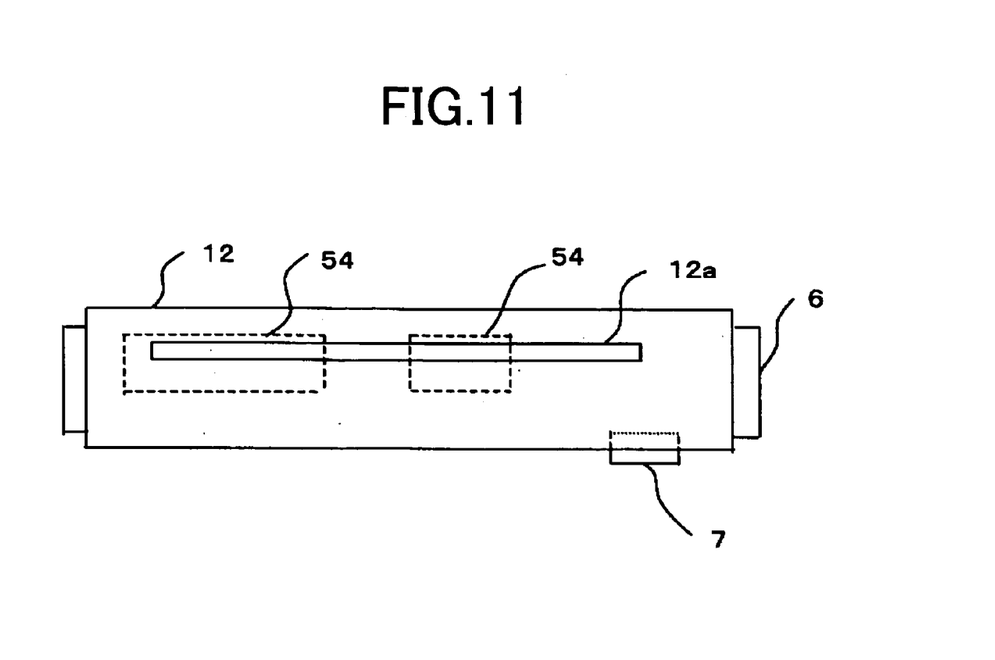
FIG. 11 is a plan view of a contact-type image sensor module according to Embodiment 4 of the present invention.

In this embodiment, since the glass 51 exists in the areas where reading by R and G is performed, the pattern and printed number which are the predetermined portions for reading by R and G light can be accurately read out. Furthermore, FIG. 11 illustrates separate glasses 54, in which case no glass 51 is inserted in the IR light reading areas among reading areas. In this case, since the glass 51 is separated into two in order to read out in two infrared-light-reactive areas, it is possible to read out also a plurality of infrared-light-reactive areas with high accuracy, and since the patterns and printed numbers are read out by R and G light, high accurate reading of almost all portions of the specified areas is possible, except for image-reading performance near the edges of the glasses 54. In order to prevent output-power variation during the image reading near the edges of the glasses 54, it is preferable that the slit portion of the conveyance guide 12 corresponding to them is painted in black, which absorbs light, to stabilize unnecessary output power. That is, on both sides of the slit, light absorption areas, each of which is in length equivalent to the thickness of the glass 54, are provided, with the areas centering on the glass edge.

According to Embodiment 4, since the transparent element is partially placed along the reading direction (main operational direction), the IR light reading areas and the other of text/pattern reading areas for paper currency, etc. are separated, which has an effect of enabling reading out simultaneously by IR, R and G light with high accuracy using one unit.

Moreover, according to Embodiment 4, the contact-type image sensor module represented in any one of Embodiments 1–3 is installed, and therefore the effect of enabling effectively reading out documents that have partially infrared light reactive areas is demonstrated.

Embodiment 5

In Embodiments 3 and 4, although the glasses 51, 52, 53 and 54 are used as transparent elements, other transparent materials may be used. For example, a transparent crystal may be used as the transparent elements. In the case of an artificial transparent crystal, the refractive index is approximately 2.0. In this case, when a transparent crystal with 1 mm thickness intervenes, the focus-position becomes 2.6 mm as illustrated in FIG. 6, and the focus-position is extended by approximately 0.5 mm compared with the case where nothing intervenes. In the unit designed with an optical length in which a transparent crystal is used as a transparent element, its removal still makes it possible to read out by IR light, even with the document surface located in a further upper position. That is, since a larger gap is created between the conveyance guide 12 and the document, even if, for example, there exists another external glass with a constant thickness (not illustrated in figure) for positioning the document, reading out by IR light may be accurately carried out. Especially, in a unit-driving-type apparatus (the unit itself moves for reading), existence of the extra margin of the gap results in the apparatus being effectively driven.

Embodiment 6

In the example represented in Embodiment 5, a transparent crystal is adopted as the transparent element, meanwhile similarly an iodine crystal is also a transparent element with a refractive index of approximately 3.3, and the extended length is 0.7 mm. In the same way, sapphire whose refractive index is approximately 1.8 may be used as a transparent element. Moreover, in cases of comparatively low speed reading (such as IR: 0.25, R: 0.25, G: 0.25 ms; total: 0.75 ms/line), the light accumulation time at the light-receiving part becomes longer, therefore a comparatively low-transmissivity semi-transparent element that is aventurine or clouded can be also used.

Although when a slit is provided on the conveyance guide 12, the reading area is empty and the conveyance guide 12 does not need to be a transparent or semi-transparent element, and a general metal plate can be used, it is preferable to use a phosphor bronze plate (copperplate including tin and phosphorus) that is rich in resilience and has high hardness, because the conveyance guide 12 needs to fix the glass or to be held by the housing 6.

Moreover, full absorption of light from every light source may be performed by baking black paint onto a copperplate. In this case, even if the distance between the light output window 101a of the light source 101 and the surface of the document changes, only the effective light (light that arrives only at the slit inside) can be reflected, therefore unnecessary light (flare light) can be prevented, and this enables more accurate reading than with the conveyance guide 12 using a transparent element.

Embodiment 7

Figure 12:
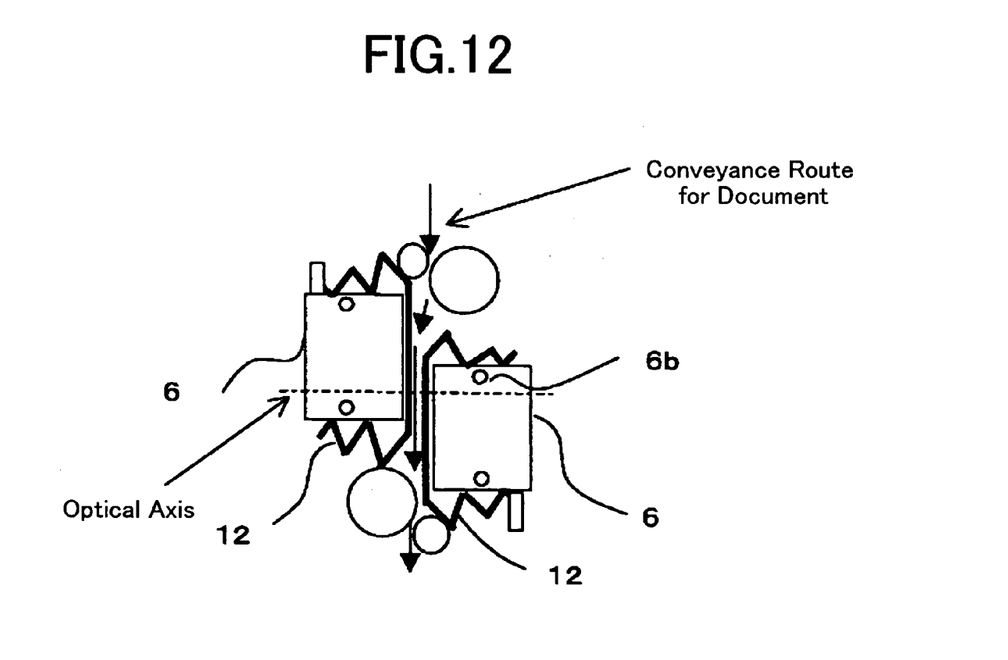
FIG. 12 is a cross sectional view of two contact-type image sensor modules and a conveyance mechanism of an image reading apparatus in Embodiment 7 of the present invention.

FIG. 12 illustrates a view of a conveyance section of paper-currency identifying apparatus when both faces of a paper bill are read out by pairing two units as a pair. The paper bill is conveyed along the conveyance guides 12 in the pair of the units, wherein the reading optical-axes of the units in the paper-bill reading section coincide. If the units were simply placed facing each other, since the paper-bill reading positions would differ from each other, there would be cases where while one of the units is in reading, no paper bill is present in the other unit. In such a case, according to phenomena such as output-power overflow, noise may be mixed in the course of reading by one of the units, and thus the reading accuracy may fall. Therefore, the reading optical-axes of the paired units are made to coincide, so that while one unit is in reading, the document is always present with respect to the other unit, resulting in the reading operation, in this case, being ensured.

Figure 13:
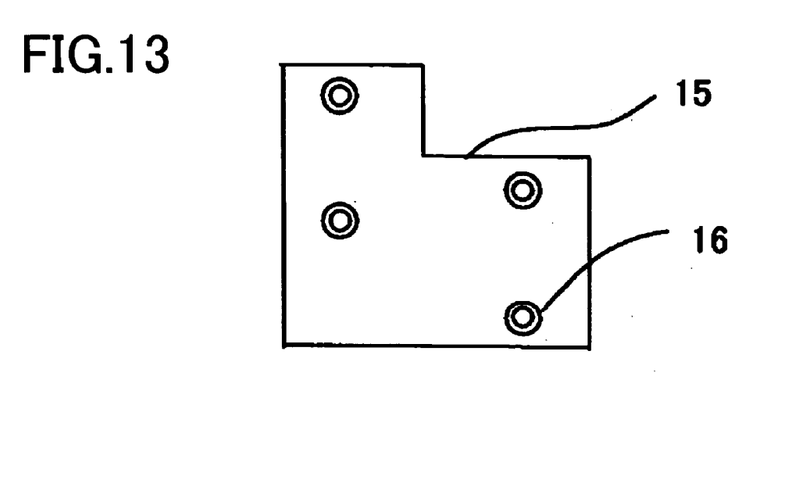
FIG. 13 is a view of a metal plate which fixes the two contact-type image sensor modules in Embodiment 7 of the present invention.

In high-speed reading (such as IR: 0.1, R: 0.1, G: 0.1 ms, and total: 0.3 ms/line), reference levels (for example, output electrical-potentials when the LEDs are off; also called "references") between two units more preferably coincide. In particular, in order to ensure conformity of the reference levels between two units, the floating of the electric potentials due to external factors is set identical. In order to do so, the two units are connected with a unified metal holder 15 (as illustrated in FIG. 13) between the housings 6. Moreover, the potential of the metal holder is made to coincide with the reference level of each unit. Generally, since the reference levels of these units have been adjusted in advance, even if changes in the ground level of the surrounding circuits, such as paper-currency identifying apparatus, affect the units, difference in the reference levels of the units do not occur, accordingly, it is possible to read out the document with high accuracy.

According to Embodiment 7, two units are placed opposite each other, the optical axes of those reading positions coincide, and the housings of the units are fixed with the same metal plate, which has an effect of preventing deterioration of the reading accuracy caused by apparatus (image reading apparatus such as a paper-currency identifying apparatus and a paper-currency collating apparatus).

Moreover, when no reference level appears on a terminal of the connector 7 in the unit, commonly connecting the potentials of the unified metal holder with the ground potential at the connector 7 of each unit will demonstrate following effects.

There are switching time among the IR, R and G light sources and blanking time (time while nothing outputted) during even one-line reading, and, when switching among the light sources, there are variations in output power due to the level variation of the electric power supply, and thus the reading accuracy may be deteriorated. Further, since the output power line goes into a high impedance state during the blanking time, and there is a large level (blanking level) fluctuation, the reading becomes likely to be influenced by noises. By coping with such problems, accurate reading can be ensured. Especially, when referring to the level of the blanking time of the output power line as the reference level, more accurate reading becomes possible, and also it demonstrates a significant effect.

In the embodiment of the present invention, although three light sources of IR, R and G light have been used instead of R, G and B ones, four kinds of light sources may be used by adding a B light source in order to perform conventional reading by R, G and B light sources, and other light source such as an ultraviolet light source, whose wavelength is shorter than IR light, may also be added.

In the embodiments of the present invention, among the conjugate lengths of the lens 2, which is a rod lens array, although the improvement by difference of the conjugate length from the center position of the lens 2 to a point above it, that is, the document surface location, has been described, the conjugate length from the center position of the lens 2 to the light-receiving position illustrated in FIG. 6 has not yet been described. However, as illustrated in FIG. 9, in the case of the embodiment of the present invention, the sensor substrate 4 is insertable into the housing 6, and the adjustment of the length from the center position of the lens 2 to the light-receiving part is performed by manipulating the sensor substrate 4 upward or downward, which provides a changeable structure. That is, when it is desired to extend the length from the center position of the lens 2, it is possible to easily change the length by adding desired filler to the contact point between the sensor substrate 4 and the housing 6, and in this case, the sensor substrate 4 and the housing 6 may be fixed by binding them in whole or in part with tape, etc. (not illustrated in figure).

In addition, in FIG. 9, the sensor IC 3 is coated with a ordinary thin-film resin 13 for protecting IC. Generally, although this thickness can be optically ignored, the optical length between the lens 2 and the light-receiving part can be extended by increasing the thickness of the resin 13.

That is, in the embodiments, the sensor IC 3 is preferably coated with transparent silicone resin with a thickness of approximately 1.85 mm, considering the thickness of the sensor IC 3 (0.35 mm) and the height of the connecting wires (wire-bonding metal wires). In this case, the thickness with respect to the conjugate length of the silicone resin is 1.5 mm, and assuming that the refractive index of the resin 13 is 1.4, the amount of extension becomes 0.43 mm, and consequently, the optical length can be extended also in this case.

What is claimed is:

1. A contact-type image sensor module comprising:
   a light source configured to irradiate two or more sorts of light including infrared light on a document;
   a lens configured to focus light reflected from the document;
   a light-receiving part configured to receive the reflected light focused by the lens;
   a housing configured to contain at least the lens and the light-receiving part; and
   a transparent element to which the document draws near or comes into contact with, the transparent element supported by the housing, and provided on an area thereof through which the reflected light passes with infrared light shielding extending to a width of 0.1 through 0.4 mm in a direction orthogonal to that in which the document travels.

2. A contact-type image sensor module as recited in claim 1, wherein:
   the transparent element has at least a two-tier structure;
   the transparent element on a side that a document face draws near is hemispherical; and
   the infrared light shielding is provided on the planar side of the hemispherical part of the transparent element.

3. A contact-type image sensor module comprising:
   a light source configured to irradiate two or more sorts of light including infrared light on a document;
   a lens configured to focus reflected light from the document;
   a light-receiving part configured to receive the reflected light focused by the lens;
   a housing configured to contain at least the lens and the light-receiving part;
   a transparent element through which the reflected light passes; and
   a document guide to which the document draws near or comes into contact, the document guide is supported by the housing, and includes a slit configured to pass the reflected light, and the document guide is configured to fix the transparent element.

4. A contact-type image sensor module as recited in claim 3, wherein the slit is in the proximity of a reading position.

5. A contact-type image sensor module comprising:
   a light source configured to irradiate two or more sorts of light including infrared light on a document;
   a lens configured to focus reflected light from the document;
   a light-receiving part configured to receive the reflected light focused by the lens;
   a housing configured to contain at least the lens and the light-receiving part;
   a transparent element placed on a part of an area of the housing configured to pass the reflected light; and
   a document guide supported by the housing and configured to draw near or come into contact with the document, and configured to detach the transparent element from the housing when the light-receiving part receives the reflected light including the infrared light.

6. A contact-type image sensor module as recited in claim 5, wherein the document guide has a slit in the proximity of a reading position.

7. An image reading apparatus comprising:
   two contact-type image sensor modules, each comprising:
      a light source configured to irradiate two or more sorts of light including infrared light on a document;
      a lens configured to focus light reflected from the document;
      a light-receiving part configured to receive the reflected light focused by the lens;
      a housing configured to contain at least the lens and the light-receiving part; and
      a transparent element to which the document draws near or comes into contact with, the transparent element supported by the housing, and provided on an area thereof through which the reflected light passes with infrared light shielding extending to a width of 0.1 through 0.4 mm in a direction orthogonal to that in which the document travels, wherein;
   optical axes of the two contact-type image sensor modules placed opposite each other are made to coincide;
   the housings of the contact-type image sensor modules are fixed to each other with a single metallic part; and
   both faces of the document are read out with the document being conveyed into a gap between the opposing document guides.

8. An image reading apparatus as recited in claim 7, wherein in each of the contact-type image sensors,
   the transparent element has at least a two-tier structure;
   the transparent element on a side thereof a document face draws near is hemispherical; and
   the infrared light shielding is provided on the planar side of the hemispherical part of the transparent element.

9. An image reading apparatus comprising:
   two contact-type image sensor modules, each comprising having:
      a light source configured to irradiate two or more sorts of light including infrared light on a document;
      a lens configured to focus reflected light from the document;
      a light-receiving part configured to receive the reflected light focused by the lens;
      a housing configured to contain at least the lens and the light-receiving part;
      a transparent element for passing through the reflected light; and
   a document guide to which the document draws near or comes into contact with, the document guide is supported by the housing attachably to or detachably from the housing, and fixes the transparent element, wherein;
   optical axes of the two contact-type image sensor modules placed opposite each other are made to coincide;

the housings of the contact-type image sensor modules are fixed to each other with a single metallic part; and both faces of the document are read out with the document being conveyed into a gap between the opposing document guides.

10. An image reading apparatus as recited in claim 9, wherein:

in each of the contact type image sensors the document guide has a slit in the proximity of a reading position thereof.

11. An image reading apparatus comprising:

two contact-type image sensor modules, each comprising having;

a light source configured to irradiate two or more sorts of light including infrared light on a document;

a lens configured to focus reflected light from the document;

a light-receiving part configured to receive the reflected light focused by the lens;

a housing configured to contain at least the lens and the light-receiving part;

a transparent element placed on a part of an area of the element for passing through the reflected light; and a document guide for fixing the transparent element, the document guide to which the document draws near or comes into contact with, and supported by the housing, wherein;

optical axes of the two contact-type image sensor modules placed opposite each other are made to coincide;

the housings of the contact-type image sensor modules are fixed to each other with a single metallic part; and both faces of the document are read out with the document being conveyed into a gap between the opposing document guides.

12. An image reading apparatus as recited in claim 11, wherein:

in each of the contact type image sensors the document guide has a slit in the proximity of a reading position.

13. A contact-type image sensor module comprising:

a light source configured to irradiate two or more sorts of light including infrared light on a document;

a lens configured to focus reflected light from the document;

a light-receiving part configured to receive the reflected light focused by the lens;

a housing configured to contain at least the lens and the light-receiving part;

a transparent element through which the reflected light passes; and a document guide to which the document draws near or comes into contact, the document guide is supported by the housing attachably to or detachably from the housing, and configured to fix the transparent element, wherein the document guide has a slit in the proximity of a reading position.

14. A contact-type image sensor module comprising:

a light source configured to irradiate two or more sorts of light including infrared light on a document;

a lens configured to focus reflected light from the document;

a light-receiving part configured to receive the reflected light focused by the lens;

a housing configured to contain at least the lens and the light-receiving part;

a transparent element placed on a part of an area of the housing configured to pass the reflected light; and a document guide supported by the housing and configured to fix the transparent element, the document guide configured to draw near or come into contact with the document, wherein the document guide has a slit in the proximity of a reading position.

* * * * *